United States Patent [19]

Tsukazaki et al.

[11] Patent Number: 5,099,791
[45] Date of Patent: Mar. 31, 1992

[54] CLUSTER BEAM THIN FILM DEPOSITION APPARATUS WITH THERMIONIC ELECTRON CONTROL

[75] Inventors: Hisashi Tsukazaki; Kenichiro Yamanishi; Seiji Yasunaga, all of Hyogo, Japan

[73] Assignee: Mitsubishi Denki Kabushiki Kaisha, Tokyo, Japan

[21] Appl. No.: 560,928

[22] Filed: Jul. 31, 1990

[30] Foreign Application Priority Data

Sep. 8, 1989 [JP] Japan .................................. 1-233969

[51] Int. Cl.⁵ .......................................... C23C 16/50
[52] U.S. Cl. .................... 118/723; 118/726; 204/192.31; 204/298.05; 427/38
[58] Field of Search ................ 118/723, 726; 427/38; 204/192.1, 192.11, 192.31, 298.02, 298.04, 298.05, 298.06, 298.11; 156/610

[56] References Cited

U.S. PATENT DOCUMENTS

| | | | |
|---|---|---|---|
| 4,082,636 | 4/1978 | Takagi | 118/723 |
| 4,098,919 | 7/1978 | Morimoto et al. | 204/192.31 |
| 4,152,478 | 5/1979 | Takagi | 428/221 |
| 4,354,909 | 10/1982 | Takagi et al. | 204/192.31 |
| 4,622,236 | 11/1986 | Morimoto et al. | 427/38 |
| 4,795,656 | 1/1989 | Mizoguchi et al. | 204/192.31 |
| 4,805,555 | 2/1989 | Itoh | 118/723 |
| 4,811,690 | 3/1989 | Kawagoe et al. | 118/723 |
| 4,812,326 | 3/1989 | Tsukazaki et al. | 204/192.31 |
| 4,919,779 | 4/1990 | Mizoguchi et al. | 204/192.31 |

FOREIGN PATENT DOCUMENTS

| | | | |
|---|---|---|---|
| 60-158619 | 8/1985 | Japan | 118/723 |
| 60-244018 | 12/1985 | Japan | 118/726 |
| 61-256622 | 11/1986 | Japan | 118/726 |
| 61-256623 | 11/1986 | Japan | 118/726 |
| 61-279668 | 12/1986 | Japan | 118/726 |
| 62-249410 | 10/1987 | Japan | 118/723 |

OTHER PUBLICATIONS

Leon I. Maissel et al., IBM, "Handbook of Thin Film Technology", 1970, pp. 1-50-1-52.

Primary Examiner—Shrive Beck
Assistant Examiner—Terry J. Owens
Attorney, Agent, or Firm—Rothwell, Figg, Ernst & Kurz

[57] ABSTRACT

An apparatus for depositing, through evaporation, a thin film on a substrate disposed in a vacuum vessel by ionizing a beam of clusters emitted from an evaporation source and causing the ionized cluster beam to impinge on the substrate, comprises a thermionic emission portion for emitting thermoelectrons disposed in a plane orthogonal to the center axis of the cluster beam, a shield plate for preventing the cluster beam from striking the thermionic emission portion, and a reflection electrode for directing the thermoelectrons emitted from the thermionic emission portion toward the center axis of the cluster beam.

25 Claims, 10 Drawing Sheets and the vacuum vessel 1 is evacuated by the evacuating device to a vacuum degree of about $10^{-4}$ Pa (about $10^{-6}$ Torr). Next, the heating filament 8 is supplied with a current to generate heat, and aluminum 4 in the crucible 3 is heated to vaporize, either by the radiant heat from the filament 8 or by collision of the thermoelectrons emitted from the filament 8. When the crucible 3 is heated up to such a temperature that the vapor pressure of aluminum 4 is about 10 to $10^3$ Pa (0.1 to several tens of Torr), aluminum vapor is ejected through the nozzle 3b. At this moment, the pressure difference between the inside of the crucible 3 and the interior of the vacuum vessel 1 causes adiabatic expansion of the aluminum vapor, resulting in the formation of the cluster beam 27 consisting of the so-called clusters, that is, aggregates of a multiplicity of atoms loosely bound together.

CLUSTER BEAM THIN FILM DEPOSITION APPARATUS WITH THERMIONIC ELECTRON CONTROL

BACKGROUND OF THE INVENTION

1. Field of the Invention

This invention relates to an apparatus for depositing a thin film on a substrate, and more particularly to an apparatus for depositing a thin film onto a substrate disposed in a vacuum vessel by ionizing a cluster beam emitted from an evaporation source and causing the ionized cluster beam to impinge on the substrate.

2. Description of the Prior Art

FIG. 1 shows a sectional view of a conventional thin film deposition system, as for instance disclosed in Japanese Patent Publication No. 54-9592 (1979). In the figure, there are shown a vacuum vessel maintained at a predetermined degree of vacuum, and an evacuation passage 2 for evacuating the vessel 1, the passage being connected to an evacuation device (not shown). A crucible 3 has a lid 3a provided with one or more nozzles 3b having an inside diameter of 1 to 2 mm. The crucible 3 is charged with an evaporation material 4, for instance, aluminum. A crucible support rod 5 is attached to a crucible support base 7 through an insulating support member 6. Means 8 for heating the crucible 8 is provided which is, for instance, a heating filament. A thermal shield plate 9 is provided for intercepting the radiant heat from the heating filament 8. The crucible 3, the heating filament 8 and the thermal shield plate 9 constitute an evaporation source 12 for heating and vaporizing the evaportion material 4 to form a cluster beam 17 consisting of clusters 26 of the evaporation material. A base plate 10 is attached to the vacuum vessel 1 by a support 11.

Denoted by 13 is a thermionic emission portion for emitting thermoelectrons 14 for ionization. The thermionic emission portion 13 comprises, as shown in FIG. 2, an ionizing filament 15, and an electron extraction electrode 16 for accelerating the thermoelectrons 14, emitted from the filament 15, so as to irradiate the cluster beam 27 with the thermoelectrons 14. Denoted by 17 is a shield plate for intercepting the heat radiated from the ionizing filament 15. The thermionic emission portion 13 and the shield plate 17 constitute ionizing means 18 for ionizing the cluster beam 27 emitted from the evaporation source 12. The ionizing filament 15 and the electron extraction electrode 16 are usually disposed on a cylindrical, conical or axisymmetric polygonal surface surrounding the cluster beam 27. The filament 15 and the extraction electrode 16 are located at positions corresponding to an ejecting angle of the cluster beam, as measured from the center of the beam, of 10 to 20 degrees. An acceleration electrode 19 is provided so that a voltage can be applied between the acceleration electrode 19 and the electron extraction electrode 16. An insulating support member 20 supports the extraction electrode 16 and the acceleration electrode 19 in an insulating manner. The insulating support member 20 is attached to the base plate 10 by a pillar 21 and an insulator 22. A substrate 23 is disposed in the vacuum vessel 1 by use of a substrate holder 24 and an insulating member 25. Numeral 28 denotes the ionized clusters, namely, the clusters ionized by the ionizing means 18.

The conventional thin film deposition system operates as follows.

In the case of evaporating and depositing a thin film of aluminum onto the substrate 23, aluminum 4 as the evaporation material is first placed in the crucible 3, and the vacuum vessel 1 is evacuated by the evacuating device to a vacuum degree of about $10^{-4}$ Pa (about $10^{-6}$ Torr). Next, the heating filament 8 is supplied with a current to generate heat, and aluminum 4 in the crucible 3 is heated to vaporize, either by the radiant heat from the filament 8 or by collision of the thermoelectrons emitted from the filament 8. When the crucible 3 is heated up to such a temperature that the vapor pressure of aluminum 4 is about 10 to $10^3$ Pa (0.1 to several tens of Torr), aluminum vapor is ejected through the nozzle 3b. At this moment, the pressure difference between the inside of the crucible 3 and the interior of the vacuum vessel 1 causes adiabatic expansion of the aluminum vapor, resulting in the formation of the cluster beam 27 consisting of the so-called clusters, that is, aggregates of a multiplicity of atoms loosely bound together.

The cluster beam 27 is irradiated with the thermoelectrons 14 extracted from the ionizing filament 15 toward the center axis of the cluster beam 27 by the electron extraction electrode 16. By the irradiation, some clusters in the cluster beam are converted into the ionized clusters 28 through the ionization of one atom in the cluster. Thus the ionized clusters 28 are accelerated appropriately by an electric field developed between the acceleration electrode 19 and the electron extraction electrode 16, to collide against the substrate 23 with the kinetic energy acquired from the field in addition to that acquired when the unionized neutral clusters 26 are ejected from the crucible 3. As a result, a thin film of aluminum is evaporated onto the substrate 23.

In the conventional thin film deposition system constructed as above, the ionizing filament 15 and the electron extraction electrode 16 constituting the thermionic emission portion are disposed on a cylindrical surface which surrounds the cluster beam 27. Therefore, an upper portion of the thermionic emission potion 13 is exposed constantly to the cluster beam 27, and, when the intensity of the cluster beam is increased in order to obtain a higher evaporation rate, the cluster beam would be condensed on the electron extraction electrode 16 or the like to cause a reaction of the clusters with the electrode material or deposition of the evaporation material 4 on the electrode 16 or the like, leading to problems such as rapid deformation of the electrode 16. To obviate the problems, it has been necessary to replace the ionizing means 18 frequently. In addition, there has been the possibility of a shortcircuit accident being caused by a large deformation of the electron extraction electrode 16 or the like.

Besides, ionization of a cluster beam with high intensity has involved difficulties in the control of ionizing conditions, because of generation of a plasma between the ionizing filament 15 and the electron extraction electrode 16 due to a high vapor density at the thermionic emission portion. Particularly in the case of using an element having a small work function, such as barium, as the evaporation material 4, deposition of the element on the ionizing filament 15 being at a high temperature would lower the work function on the filament surface, causing a rapid increase in the thermionic emission quantity and, hence, troubles such as breakage of a power supply for ionization.

On the other hand, an increase in the diameter of the thermionic emission portion 13 in order to prevent the irradiation of the thermionic emission portion 13 with the cluster beam involves an increase in the outside dimensions of the ionizing means 18, making it impossible to construct a compact system advantageous on the basis of evacuation time and cost.

As a method of controlling the irradiation of the thermionic emission portion 13 with the cluster beam, use of a thermionic emission portion formed in a divergent conical shape is easy to think out. In fact, there has been known an ionizing means, as shown in FIG. 3, described in the literature: W. Knauer and R. L. Poeschei, Ionized cluster beam deposition, J. Vac. Sci. Technol., B6(1), 1988, pp. 456-460. This system, originally used for analytical studies of rare gas cluster beams, was converted to an ionizing means for film deposition, in which a cluster beam 27a passing through a hole 4 in a shield plate 40 is caused to pass through the inside of divergent electron extraction electrodes 16 and an ionizing filament 15. The means, however, has problems as to machining technique, for instance, difficulties in shaping a plurality of conical electron extraction electrodes accurately and in assembling the electrodes with good reproducibility.

SUMMARY OF THE INVENTION

This invention contemplates a solution to the above-mentioned problems.

It is accordingly a first object of this invention to provide an apparatus for depositing a thin film which is capable of stable ionization of a cluster beam for a long time.

It is a second object of this invention to provide an apparatus for depositing a thin film which suffers little deformation of an electron extraction electrode and, therefore, has no possibility of a shortcircuit accident between electrodes or the like.

It is a third object of this invention to provide an apparatus for depositing a thin film which is free from the possibility of plasma generation between an ionizing filament and an electron extraction electrode, and from difficulties in control of ionizing conditions or the like.

It is a fourth object of this invention to provide an apparatus for depositing a thin film in which a rapid increase in the thermionic emission quantity due to deposition of the vapor of an evaporation material on an ionizing filament is prevented, even where an element with a small work function, such as barium, is used as the evaporation material, and in which breakage of a power supply for ionization or other similar troubles will not occur.

It is a fifth object of this invention to provide an apparatus for depositing a thin film in which it is unnecessary to enlarge the outside dimensions of an ionizing means and which has a compact construction profitable on the basis of evacuation time and cost.

It is a sixth object of this invention to provide an apparatus for depositing a thin film in which it is easy to secure the accuracy of component parts and it is possible to assemble the component parts with good reproducibility.

It is a seventh object of this invention to provide an apparatus for depositing a thin film in which it is possible to construct a compact ionizing means, with a prolonged useful life.

In order to attain the above-mentioned objects, an apparatus for depositing a thin film comprises a thermionic emission portion for emitting thermoelectrons, the thermionic emission portion disposed in a plane orthogonal to the center axis of a cluster beam, a shield plate disposed between the thermionic emission portion and an evaporation source so as to shield the thermionic emission portion from the cluster beam coming from the evaporation source, and a reflection electrode for directing the thermoelectrons, emitted from the thermionic emission portion, toward the center axis of the cluster beam.

That is, in this invention, the thermoelectrons for ionization are extracted vertically upward by the electron extraction electrode, and then the trajectory of the thermoelectrons is deflected by the reflection electrode so as to irradiate the cluster beam with the thermoelectrons, thereby ionizing the clusters. In this case, the shield plate prevents the direct irradiation of the thermionic emission portion, comprising the ionizing filament and the electron extraction electrode, with the cluster beam.

The above and other objects and novel features of this invention will become more fully understood from the following detailed description taken in conjunction with the accompanying drawings, which are given by way of explanation only and are not to be construed as limitative of the scope of the invention.

DETAILED DESCRIPTION OF THE PREFERRED EMBODIMENTS

Some preferred embodiments of this invention will now be described in detail below while referring to the accompanying drawings.

Figure 1:
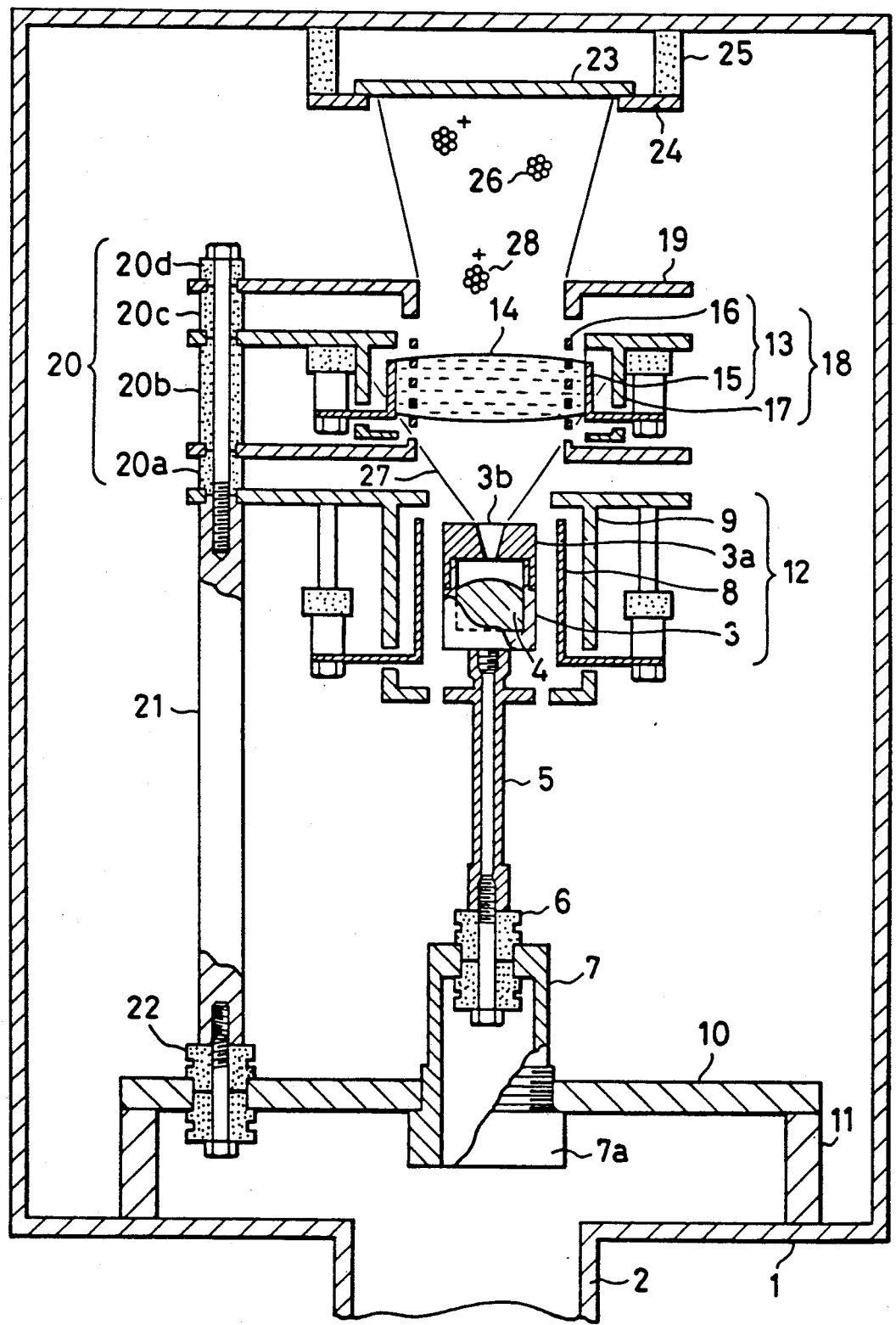
FIG. 1 is a sectional view of a conventional thin film deposition system.
Figure 2:
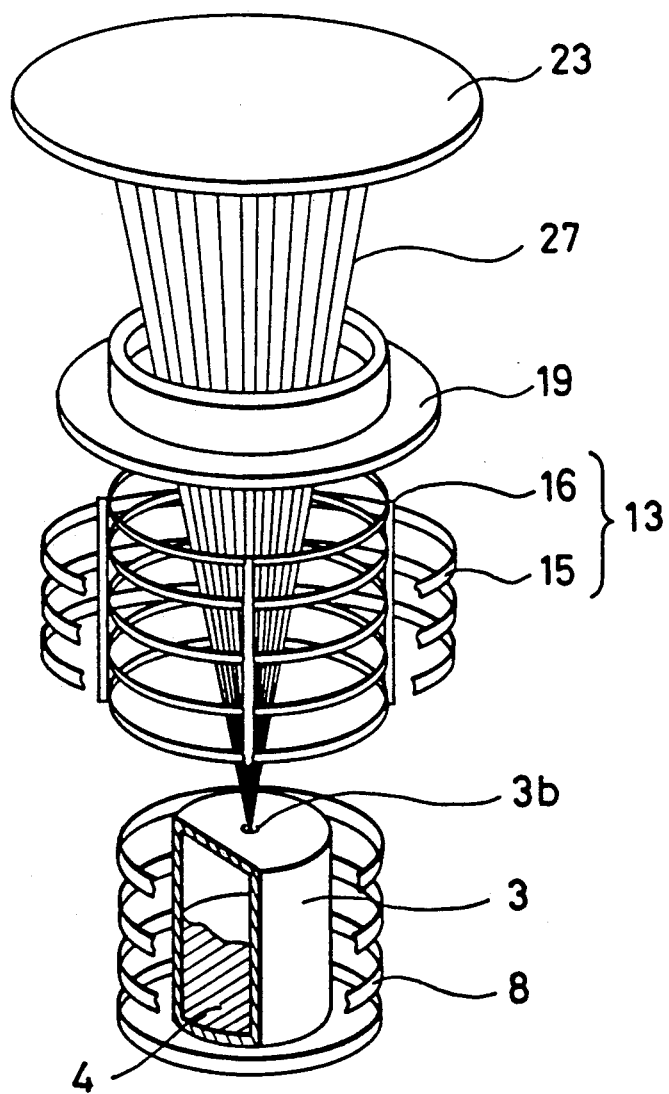
FIG. 2 is a perspective view, partly broken away, of an important portion of the conventional thin film deposition system.
Figure 3:
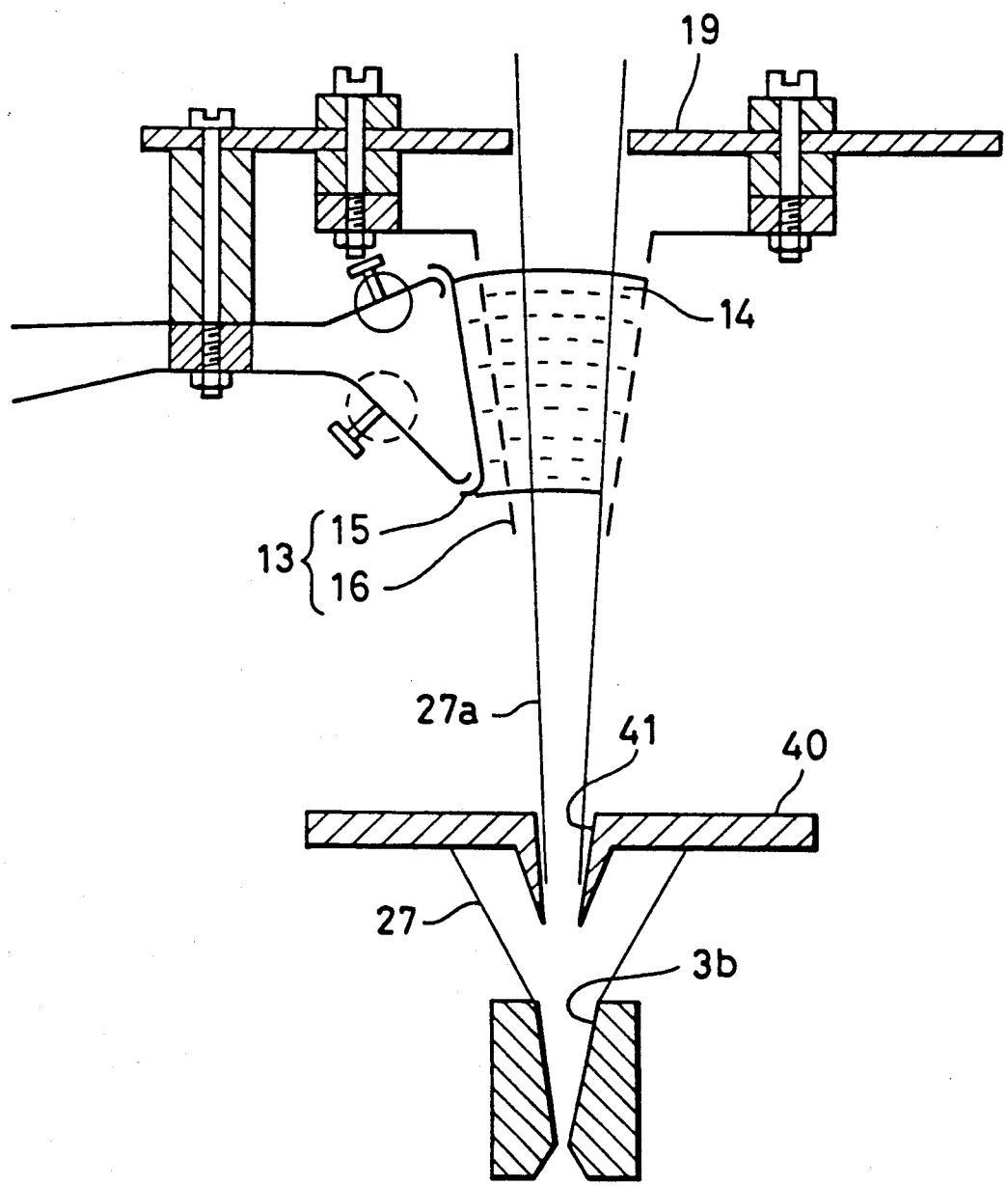
FIG. 3 is a sectional view of a portion of an ionizing means according to the prior art.
Figure 4:
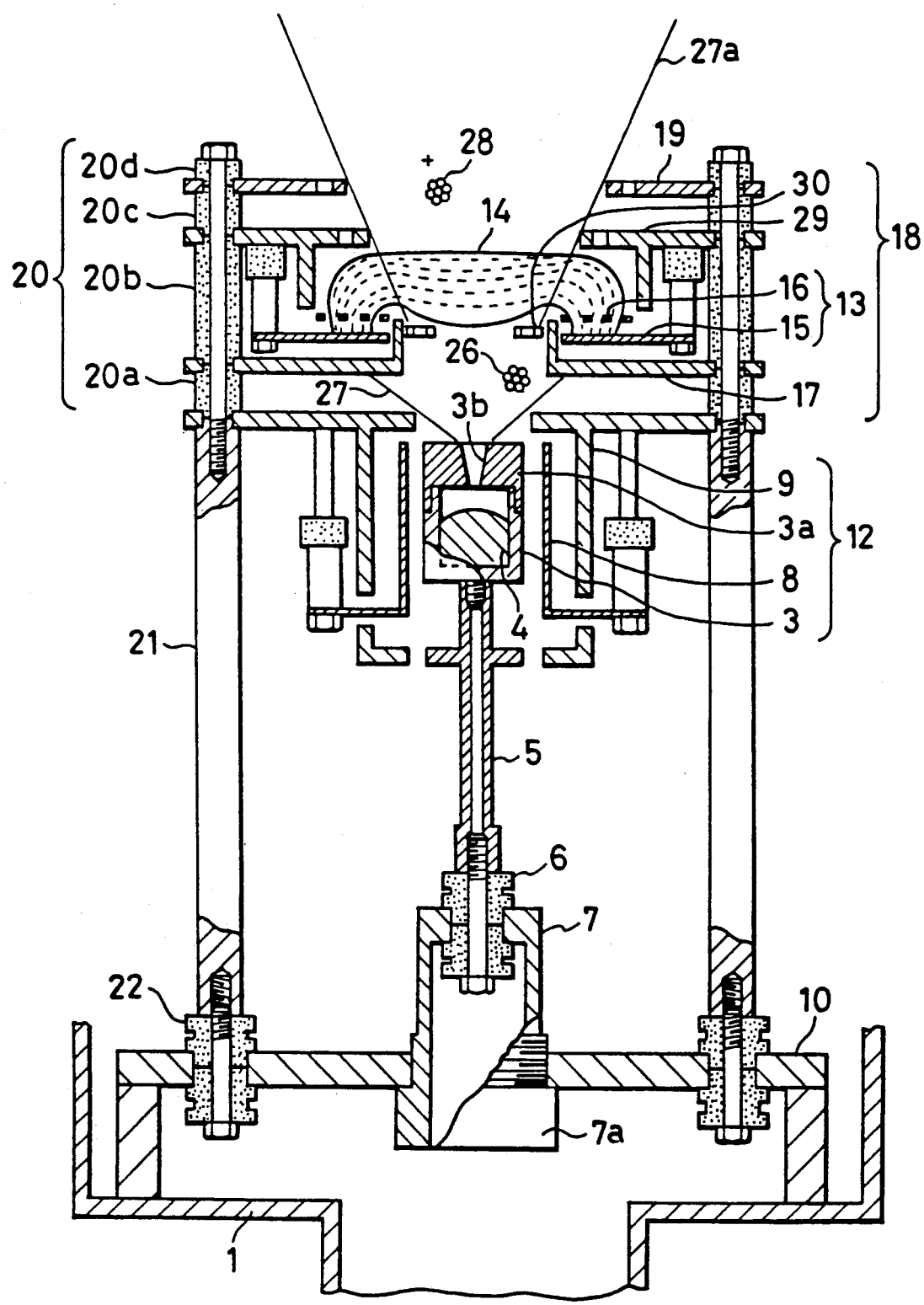
FIG. 4 is a sectional view of an apparatus for depositing a thin film according to one embodiment of this invention.
Figure 5:
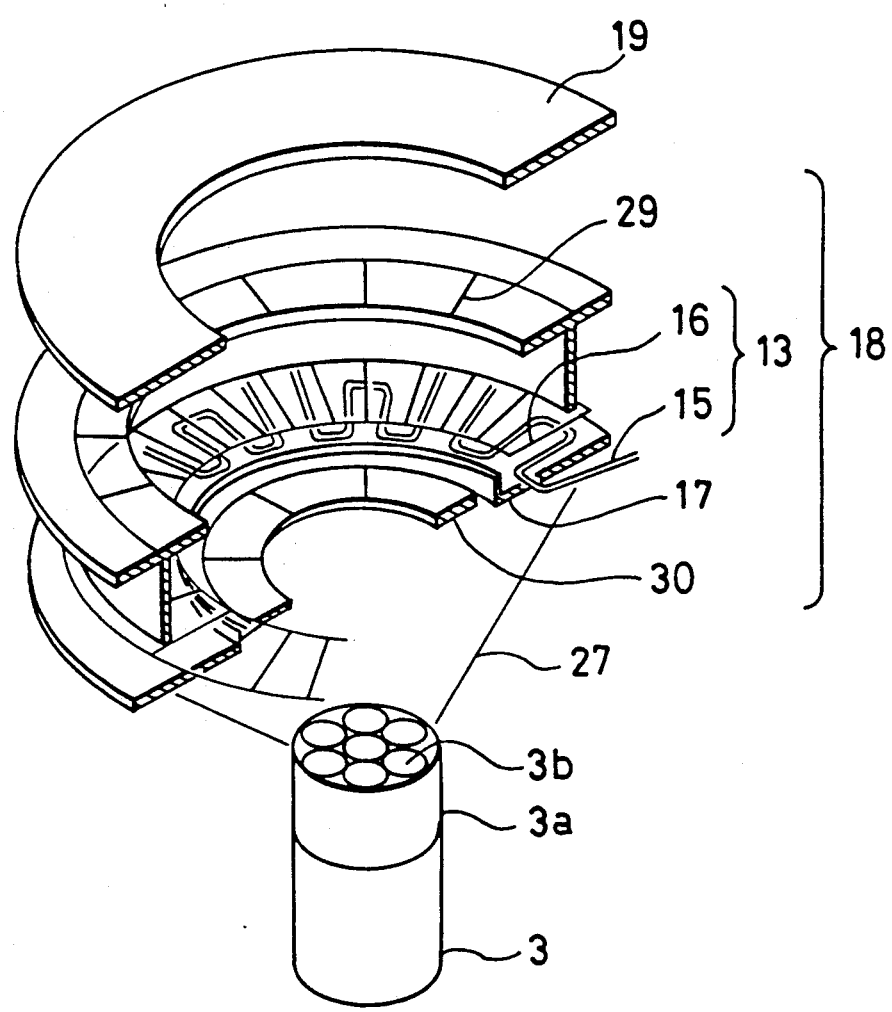
FIG. 5 is a perspective view, partly broken away, of an important portion of the apparatus for depositing a thin film according to one embodiment of this invention.

In FIG. 4, numeral 13 denotes a thermionic emission portion for emitting thermoelectrons for ionization. The thermionic emission portion, as shown in detail in FIG. 5, is disposed in an annular shape in a horizontal plane, and has an aperture for permitting a cluster beam 27 to pass therethrough. The aperture is so sized as to permit the passage therethrough of a cluster beam with an ejection angle, measured from the center axis of the cluster beam 27, of at least 15°, desirably at least 30°. The thermionic emission portion 13 comprises an ionizing filament 15 and an electron extraction electrode 16 by which the thermoelectrons emitted from the ionizing filament 15 are accelerated to irradiate the cluster beam 27 therewith. The spacing between the ionizing filament 15 and the electron extraction electrode 16 should be, for example, about 5±0.2 mm, in order to obtain the desired thermionic emission characteristics. Since both the filament 15 and the extraction electrode 16 are flat in shape, it is possible to set the spacing with good reproducibility and high accuracy. Even when the aperture diameter of the thermionic emission portion 13 is set to correspond to an ejection angle of at least 30°, it is possible to construct the thermionic emission portion 13 in a compact design, because the diameter of the cluster beam 27 in the vicinity of the outlet of a nozzle 3b is comparatively small and because the electron extraction electrode 16 is flat in shape and capable of being made much thinner as compared with the prior art. A shield plate 17 reduces the radiant heat from the ionizing filament 15, disposed in a lower portion of the thermionic emission portion 13, and prevents the direct irradition of the thermionic emission portion 13 with the cluster beam 27 ejected in directions corresponding to large ejection angles. A reflection electrode 29 deflects the trajectory of the ionizing thermoelectrons 14 extracted substantially vertically upward from the thermionic emission portion 13, in such a manner that the cluster beam 27a having passed through the thermionic emission portion 13 is irradiated with the thermoelectrons 14. The electric potential of the reflection electrode 29 may ordinarily be set approximately equal to the electric potential of the ionizing filament 15. Denoted by 30 is a mesh-shaped control electrode, a potential given to which is appropriately set so as to control the region in which the thermoelectrons 14 for ionization are present, thereby arbitrarily controlling the ion distribution in the cluster beam 27a. The thermionic emission portion 13, the shield plate 17, the reflection electrode 29 and the control electrode 30 constitute an ionizing means 18. Numeral 19 denotes an acceleration electrode. The reflection electrode 29 and the acceleration electrode 19 are, in part, formed in a mesh shape, in order to reduce the area of collision of the cluster beam 27a thereagainst.

As for the materials for the component parts, a tungsten wire may be used for the ionizing filament 15, whereas molybdenum or tantalum may be used for the electron extraction electrode 16, reflection electrode 29 and control electrode 30 after being shaped in a mesh form by chemical etching or electric discharge machining. For the shield plate 17, a high melting point metal or ceramic may be used. Where aluminum is used as the evaporation material 4, it is possible to achieve an increase in the useful life of the shield plate 17 or the like by use of ultra high density graphite (a product by POCO Co., U.S.A., sold under the product name DFP-3) as a material for the shield plate 17 or the like.

The apparatus with the above construction operates as follows.

Referring first to the operation of the ionizing means 18, only a central portion of the cluster beam 27 generated by the same process as in the prior art passes through the shield plate 17. Therefore, the thermionic emission portion 13 is not at all irradiated with the cluster beam 27a. On the other hand, the ionizing filament 15 is supplied with an electric current to generate heat, and a voltage of 50 to 500 V is applied between the filament 15 and the electron extraction electrode 16, whereby the thermoelectrons 14 are extracted vertically upward. The trajectories of the thermoelectrons 14 are bent toward the center axis of the cluster beam by an electric field developed by the reflection electrode 29, the electric potential of which is approximately equal to the electric potential of the ionizing filament 15. Thus, the cluster beam 27a having passed through the shield plate 17 is irradiated with the thermoelectrons 14, resulting in formation of ionized clusters 28. The current value of the thermoelectrons 14 extracted from the ionizing filament 15 is ordinarily set in the range of about 50 to 1000 mA. Part of the cluster beam 27 colliding against the shield plate 17 is deposited as it is, without re-vaporization. Because the spacing between the shield plate 17 and the evaporation source 12 is large, however, a shortcircuit accident is scarcely caused by the deposit. For instance, upon an experiment using aluminum as the evaporation material to deposit a thin film of aluminum at a deposition rate of 66 nm/min, it was found that the apparatus is capable of being operated continuously for a long time of at least 40 hours, which value corresponds to 100 or more times the value achieved in the prior art.

Now, the operation of the control electrode 30 will be described.

Figure 6:
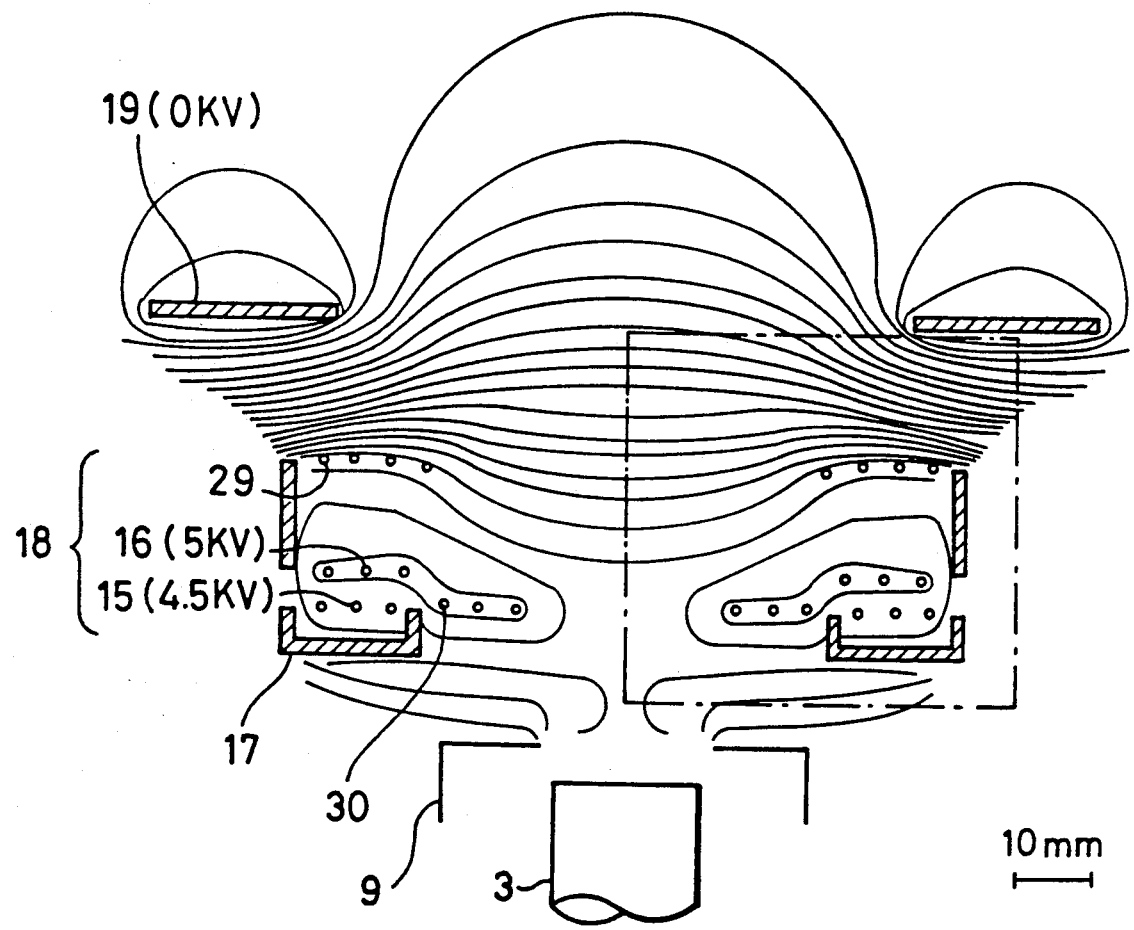
FIGS. 6, 7 and 8 are each an illustration of the electric potential distribution in an important portion of the apparatus for depositing a thin film according to one embodiment of this invention.
Figure 7:
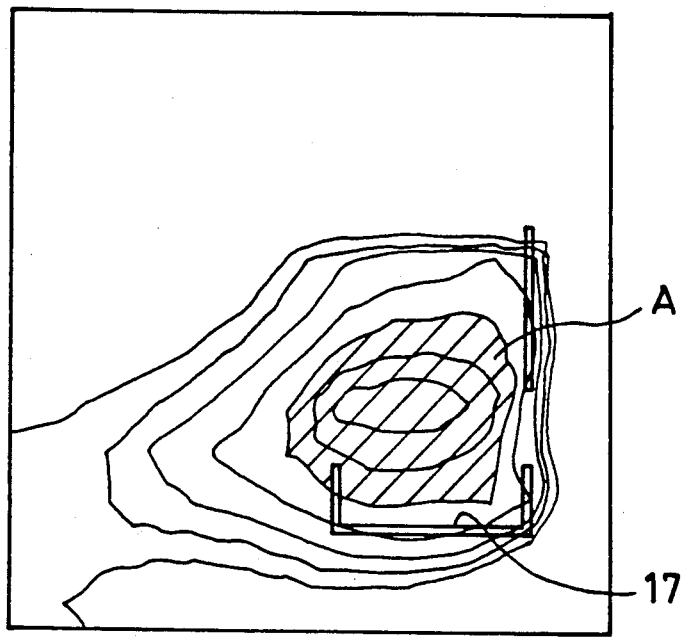
Figure 8:
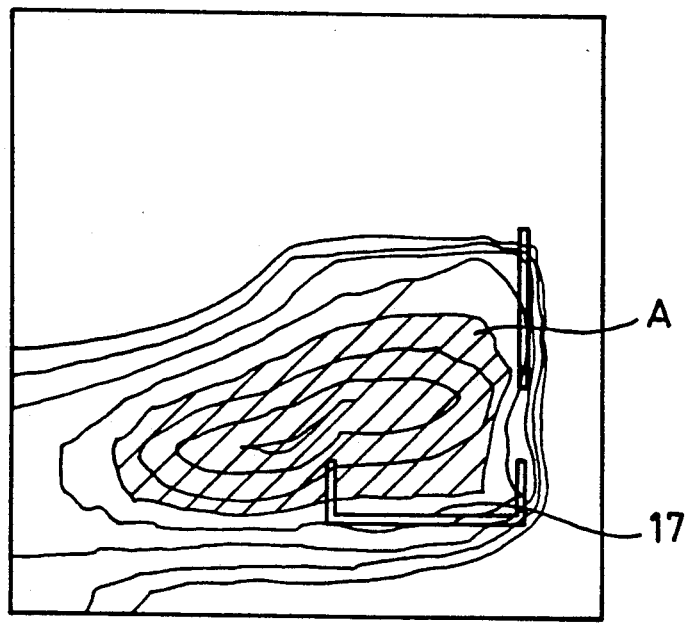

The control electrode 30 is provided for controlling the ionizing region in the ionizing means 18, in order to uniformize the ion distribution in the cluster beam 27a. FIG. 6 shows an example of the results of numerical calculations of the electric potential distribution in the ionizing means 18, in which equipotential lines are given at intervals of 0.5 kV. FIG. 7 shows, in an enlarged form, the results of numerical calculations of the potential distribution in the region bounded by the dash-and-dot line in FIG. 6, with the potential of the control electrode 30 assumed to be approximately equal to the potential (4.5 kV) of the ionizing filament 15. FIG. 8 similarly shows, in an enlarged form, the results of numerical calculations of the potential distribution in the region bounded by the dash-and-dot line in FIG. 6, with the potential of the control electrode 30 assumed to be approximately equal to the potential (5 kV) of the electron extraction electrode 16. The shaded region A in each of the FIGS. 7 and 8 represents the region in which the thermoelectrons for ionization are present. FIGS. 7 and 8 show that it is possible, by appropriately setting the electric potential of the control electrode 30, to regulate the region of presence of the ionizing thermoelectrons and, thereby, to control the ionizing region in the ionizing means 18.

Figure 9:
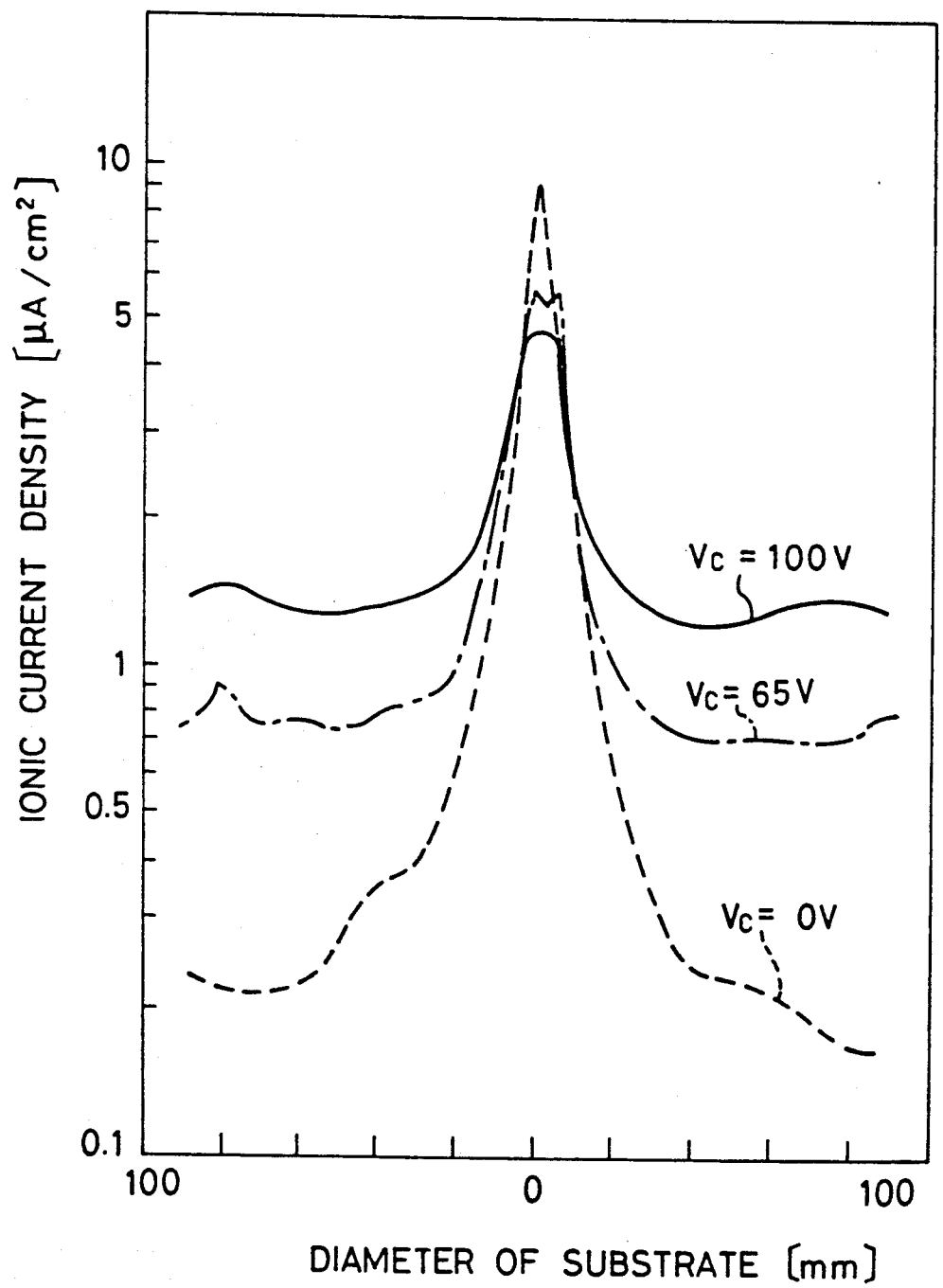
FIG. 9 shows a graph of measurements of ion current density distribution on a substrate in the apparatus for depositing a thin film according to one embodiment of this invention.

FIG. 9 shows the results of measurement of ionic current density distribution on the substrate 23, for different values of the electric potential (Vc) of the control electrode 30, in the case of evaporating a thin film of aluminum onto the substrate 23 with an acceleration voltage of 5 kV and at a deposition rate of 66 nm/min by use of the apparatus for depositing a thin film of this invention. By appropriately setting the electric potential of the control electrode 30, it was possible to obtain an extremely flat distribution of ionic current density, with the maximum-to-minimum ratio of distribution of about 3:1, even at the high acceleration voltage of 5 kV.

Although the control electrode 30 is irradiated with the cluster beam 27a, the irradiation does not render the ionization operation unstable, because the control electrode 13 is used only for setting an electric potential, unlike the thermionic emission portion 13. The deposition of the cluster beam 27a on the control electrode 30 may be a problem, depending on the vapor pressure of the evaporation material 4 used; in that case, however, it is possible to solve the problem by designing the control electrode 30 to be heated by passing a current therethrough.

Although the above embodiment has been described with reference to the use of a tungsten wire as the ionizing filament 15, other shapes and other materials are also applicable to the ionizing filament 15, because the thermionic emission portion 13 in this invention can be formed in a flat shape. For instance, plates or sheets of tungsten, tantalum, etc., lanthanum hexaboride (LaB$_6$), which emits thermoelectrons at a low temperature, and the like are usable for the ionizing filament 15.

Figure 10:
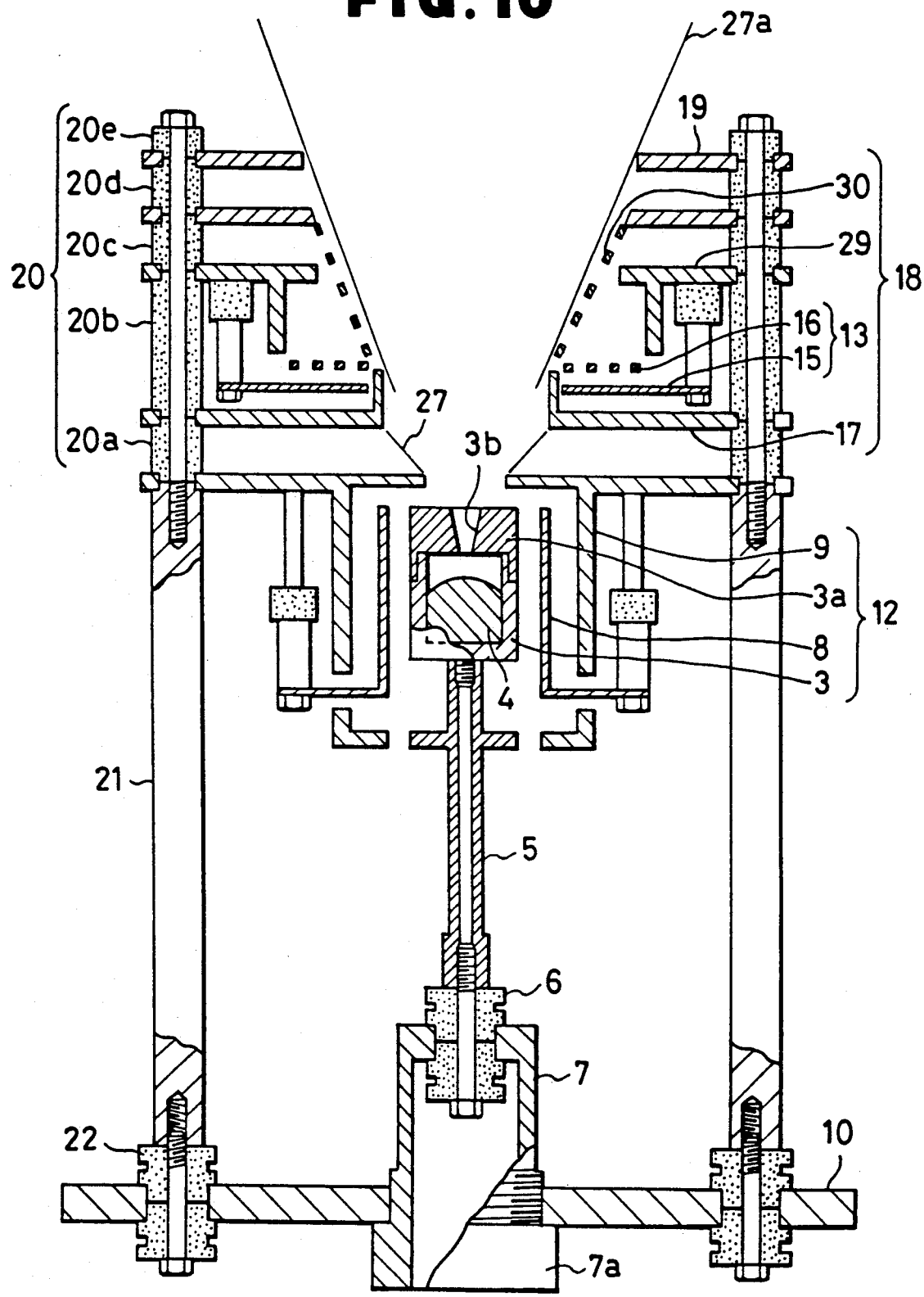
FIG. 10 is a sectional view of an apparatus for depositing a thin film according to another embodiment of this invention.

Furthermore, although the above embodiment has been described referring to the use of the control electrode 30 of an annular shape, the same effect as in the above embodiment is obtainable by use of other electrode shapes, for instance, a conical shape as shown in FIG. 10.

The ionizing means 18 in the above embodiment has been described as being shaped substantially in rotation symmetry with respect to the center axis of the cluster beam 27 and as being provided with a circular aperture. It is also possible, however, to obtain the same effect as in the above embodiment by use of other electrode shapes, for instance, rectangular or polygonal electrode or aperture.

Although the above embodiment has been explained with reference to the ionizing means 18 provided with the control electrode 30 in order to realize a uniform ion distribution, this invention is applicable to the case where an ionizing means without any control electrode therein is used because the object of film deposition does not require a considerable uniformity of ion distribution. In that case, also, the invention produces the same effect as above, on the stability of the ionizing operation, the useful life of the electrodes, and the like.

Figure 11:
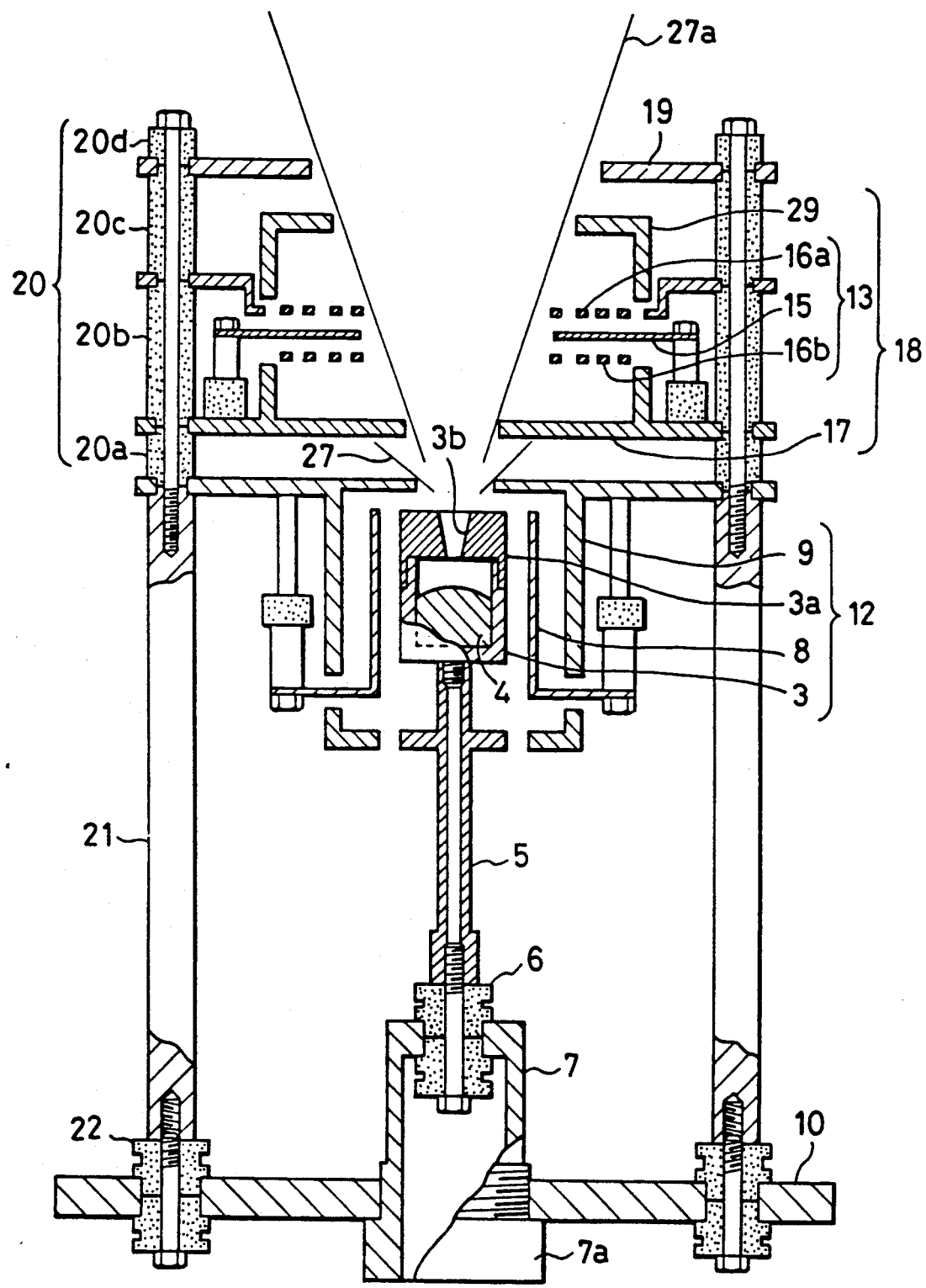
FIG. 11 is a sectional view of apparatus for depositing a thin film according to a further embodiment of this invention.

In the description of the embodiment above, the electron extraction electrode 16 has been described as being provided on the upper side of the ionizing filament 15 to extract the thermoelectrons 14 upward. As shown in FIG. 11, however, electron extraction electrodes 16a, 16b may be provided on the upper and lower sides of the ionizing filament 15 to extract the thermolectrons on both sides of the filament 15 for the purpose of increasing the current of the ionizing thermoelectrons 14. In that case, the reflecting electric field for the thermoelectrons 14 extracted downward is developed by the shield plate 17 set at substantially the same potential as the ionizing filament 15.

As has been stated hereinabove, according to this invention a thermionic emission portion comprising an ionizing filament and an electron extraction electrode is disposed in a horizontal plane, and a reflection electrode is disposed opposite to the thermionic emission portion. This construction enables an apparatus for depositing a thin film which is capable of performing stable ionization of the cluster beam for a long time, without any possibility of irradiation of the thermionic emission portion with the cluster beam, and has a compact design as well as a long useful life.

What is claimed is:

1. Apparatus for depositing a thin film which includes a vacuum vessel maintained at a predetermined degree of vacuum, an evaporation source for ejecting a vapor of an evaporation material to be deposited upon a substrate disposed in the vacuum vessel, so as to generate a cluster beam comprising clusters of a multiplicity of atoms loosely bound together in the vapor, means for irradiating the cluster beam from the evaporation source with thermoelectrons to ionize part of the clusters, and an acceleration electrode for accelerating the ionized clusters to cause the ionized clusters to impinge upon the substrate together with the unionized cluster beam, thereby depositing a thin film on the substrate, comprising:

a thermionic emission portion including ionizing means for emitting thermoelectrons, said thermionic emission portion being disposed in a plane orthogonal to the center axis of the cluster beam;

a shield plate disposed between the thermionic emission portion and the evaporation source in order to prevent direct irradiation of the thermionic emission portion with the cluster beam ejected from the evaporation source; and a reflection electrode for directing the thermoelectrons extracted from the thermionic emission portion in a direction toward the center axis of the cluster beam.

2. The apparatus as set forth in claim 1, wherein the thermionic emission portion comprises an aperture permitting the cluster beam to pass therethrough, and the aperture is sized and shaped to be divergent in the ejecting direction of the cluster beam so as to permit the passage therethrough of the cluster beam with an ejection angle of at least 15°, the ejection angle measured from the center axis of the cluster beam.

3. The apparatus as set forth in claim 1 or 2, wherein said ionizing means comprises an ionizing filament for emitting the thermoelectrons, and said thermionic emission portion comprises a thermoelectron extraction electrode for accelerating the thermoelectrons to irradiate the cluster beam with the thermoelectrons, the spacing between the ionizing filament and the thermoelectron extraction electrode being about 5 mm.

4. The apparatus as set forth in claim 1, wherein the reflection electrode is formed in a mesh shape through chemical etching or electric discharge machining.

5. The apparatus as set forth in claim 1 or 4, wherein the reflection electrode comprises molybdenum.

6. The apparatus as set forth in claim 1 or 4, wherein the reflection electrode comprises tantalum.

7. The apparatus as set forth in claim 1, wherein the shield plate comprises a metal.

8. The apparatus as set forth in claim 1, wherein the shield plate comprises a ceramic.

9. The apparatus as set forth in claim 1, wherein aluminum is used as the evaporation material, and the shield plate comprises ultra high density graphite.

10. The apparatus as set forth in claim 1, wherein the ionizing means of said thermionic emission portion includes an ionizing filament for emitting the thermoelectrons and the reflection electrode and the ionizing filament are set at approximately equal electric potentials.

11. The apparatus as set forth in claim 3, wherein the ionizing filament comprises a tungsten wire.

12. The apparatus as set forth in claim 3, wherein the ionizing filament comprises a plate formed of a tungsten material.

13. The apparatus as set forth in claim 3, wherein the ionizing filament comprises a plate formed of a tantalum material.

14. The apparatus as set forth in claim 3, wherein the ionizing filament comprises lanthanum hexaboride (LaB$_6$).

15. The apparatus as set forth in claim 1, wherein the ionizing means comprises a control electrode for controlling the ion distribution in the region in which the thermoelectrons for ionization are present, the control electrode is inserted loosely in an aperture in said shield plate, and the ionizing means controls the ion distribution in the cluster beam.

16. The apparatus as set forth in claim 15, wherein the control electrode is formed in an annular shape.

17. The apparatus as set forth in claim 15, wherein the control electrode is formed in a conical shape.

18. The apparatus as set forth in claim 16 or 17, wherein the control electrode is formed in a mesh shape through chemical etching or electric discharge machining.

19. The apparatus as set forth in claim 18, wherein the control electrode comprises molybdenum.

20. The apparatus as set forth in claim 18, wherein the control electrode comprises tantalum.

21. The apparatus as set forth in claim 15, wherein the control electrode is capable of resistance heating.

22. The apparatus as set forth in claim 2, wherein the aperture is formed in a circular shape so as to cause the cluster beam to be ejected from the aperture in a conical form divergent in the ejecting direction.

23. The apparatus as set forth in claim 2, wherein the aperture is formed in a polygonal shape so as to cause the cluster beam to be ejected from the aperture in a polygonal pyramidal form divergent in the ejecting direction.

24. The apparatus as set forth in claim 1 or 2, wherein the thermionic emission portion comprises one ionizing filament for emitting the thermoelectrons, and two thermoelectron extraction electrodes for accelerating the thermoelectrons to irradiate the cluster beam with the thermoelectrons, the thermoelectron extraction electrodes disposed on both sides of the ionizing filament as viewed in the direction of ejection of the cluster beam.

25. The apparatus as set forth in claim 24, wherein the electric potential of the shield plate is set approximately equal to the electric potential of the ionizing filament.

* * * * *